United States Patent
Hübner et al.

(10) Patent No.: US 9,301,396 B2
(45) Date of Patent: Mar. 29, 2016

(54) CONNECTING ELEMENT FOR A MULTI-CHIP MODULE AND MULTI-CHIP MODULE

(75) Inventors: Holger Hübner, Baldham (DE); Björn Hoxhold, Regensburg (DE); Axel Kaltenbacher, Mintraching (DE)

(73) Assignee: OSRAM GmbH, München (DE)

( * ) Notice: Subject to any disclaimer, the term of this patent is extended or adjusted under 35 U.S.C. 154(b) by 126 days.

(21) Appl. No.: 14/237,177

(22) PCT Filed: Aug. 3, 2012

(86) PCT No.: PCT/EP2012/065257
§ 371 (c)(1),
(2), (4) Date: Apr. 1, 2014

(87) PCT Pub. No.: WO2013/020920
PCT Pub. Date: Feb. 14, 2013

(65) Prior Publication Data
US 2014/0291003 A1  Oct. 2, 2014

(30) Foreign Application Priority Data

Aug. 9, 2011 (DE) .......... 10 2011 080 705

(51) Int. Cl.
| | |
|---|---|
| *H05K 1/11* | (2006.01) |
| *H05K 1/18* | (2006.01) |
| *H01L 23/00* | (2006.01) |
| *H01L 23/13* | (2006.01) |
| *H01L 23/14* | (2006.01) |

(52) U.S. Cl.
CPC ............... *H05K 1/181* (2013.01); *H01L 24/24* (2013.01); *H01L 24/25* (2013.01); *H01L 23/13* (2013.01); *H01L 23/14* (2013.01); *H01L 24/82* (2013.01); *H01L 2224/24011* (2013.01); *H01L 2224/24101* (2013.01); *H01L 2224/24137* (2013.01); *H01L 2224/24155* (2013.01); *H01L 2224/25171* (2013.01); *H01L 2224/821* (2013.01);

(Continued)

(58) Field of Classification Search
CPC ........ H05K 1/181; H01L 24/24; H01L 24/25; H01L 23/13; H01L 23/14; H01L 2924/12041; H01L 2224/8203; H01L 2224/96; H01L 2224/25171; H01L 2224/24155; H01L 2224/24137; H01L 2224/24101; H01L 2224/821; H01L 24/82; H01L 2224/24011
See application file for complete search history.

(56) References Cited

U.S. PATENT DOCUMENTS

| | | | |
|---|---|---|---|
| 4,130,722 A | 12/1978 | Levijoki | |
| 4,288,840 A * | 9/1981 | Konishikawa et al. | 361/778 |

(Continued)

FOREIGN PATENT DOCUMENTS

| | | |
|---|---|---|
| EP | 0568312 A2 | 11/1993 |
| WO | 9401888 A1 | 1/1994 |
| WO | 0233756 A1 | 4/2002 |

*Primary Examiner* — Hoa C Nguyen
(74) *Attorney, Agent, or Firm* — Slater & Matsil, L.L.P.

(57) ABSTRACT

A connecting element can be used for a multi-chip module. The connecting element is provided for establishing an electrical connection between two elements and has a carrier and a first electrically conductive connecting structure on a first main surface of the carrier. The first connecting structure is designed in such a way that the first connecting structure connects the first and second elements to each other. A multi-chip module can have such a connecting element and two elements, wherein the two elements are electrically connected to each other in a wireless manner by the connecting element.

11 Claims, 4 Drawing Sheets

(52) U.S. Cl.
CPC ..... *H01L2224/8203* (2013.01); *H01L 2224/96* (2013.01); *H01L 2924/12041* (2013.01)

(56) References Cited

U.S. PATENT DOCUMENTS

| | | | |
|---|---|---|---|
| 6,396,000 B1 * | 5/2002 | Baum | 174/261 |
| 6,540,377 B1 | 4/2003 | Ota et al. | |
| 6,628,538 B2 * | 9/2003 | Funaba et al. | 365/63 |
| 6,751,101 B2 * | 6/2004 | Sakai | 361/736 |
| 6,864,192 B1 * | 3/2005 | Liou et al. | 438/780 |
| 2003/0042585 A1 * | 3/2003 | Corisis et al. | 257/668 |
| 2005/0258529 A1 | 11/2005 | Green et al. | |
| 2009/0057000 A1 * | 3/2009 | Kraus et al. | 174/262 |

* cited by examiner

CONNECTING ELEMENT FOR A MULTI-CHIP MODULE AND MULTI-CHIP MODULE

This patent application is a national phase filing under section 371 of PCT/EP2012/065257, filed Aug. 3, 2012, which claims the priority of German patent application 10 2011 080 705.5, filed Aug. 9, 2011, each of which is incorporated herein by reference in its entirety.

TECHNICAL FIELD

The present application relates to a connecting element for a multi-chip module.

BACKGROUND

In conventional multi-chip modules or lighting modules, such as are described, for example, in the International patent publication no. WO 02/33756 A1, the electrical connection between two elements of the multi-chip module or lighting module is effected by a wiring of the two elements. A crossover of bonding wires, of so-called wire bonding bridges, is largely avoided here in order to prevent short circuits.

SUMMARY OF THE INVENTION

The present application relates to a connecting element for a multi-chip module. The connecting element is provided for realizing an electrical connection between two elements of the multi-chip module. Furthermore, the present application relates to a multi-chip module which, for example, is a lighting module and has a plurality of radiation-emitting components.

Embodiment of the present invention specify a means for an improved electrical interconnection of a multi-chip module.

In accordance with one preferred embodiment, the connecting element comprises a carrier and a first electrically conductive connecting structure, which is arranged on a first main surface of the carrier, wherein the first connecting structure is designed in such a way that it connects the first and second elements to one another. In this case, the connection can run diagonally, in particular, such that the first connecting structure is designed in such a way that it connects the first and second elements to one another diagonally. By means of the connecting element, an electrical connection can then be produced, for example, between two elements which are arranged on a diagonal within a multi-chip module.

In the present case, a planar connecting method is preferably employed for interconnecting the elements of the multi-chip module. In this case, the multi-chip module is provided with contact webs which electrically connect the elements to one another. The electrically conductive contact webs replace conventional wirings. For leveling the multi-chip module surface, the elements are, in particular, at least partly embedded into a potting, in or on which the contact webs can be arranged. In accordance with one preferred variant, for producing the contact webs, an electrically conductive coating is applied to a surface of the potting in particular over the whole area and is structured such that electrical connection locations of the elements are connected by the contact webs. The potting is advantageously opened in the region of the electrical connection locations, such that the electrically conductive coating or the contact webs can extend as far as the electrical connection locations.

Suitable materials for the connecting structure and/or the contact webs are, for example, Cu, Au, Ag, Al, Cr, Zn or a TCO ("Transparent Conductive Oxide"). In particular, the connecting structure and/or the contact webs are/is at the same time embodied in a reflective fashion. In this case, the connecting structure and/or the contact webs are/is preferably formed from silver-plated or chromium-plated copper.

In accordance with one preferred configuration, in the present case two elements of the multi-chip module are interconnected by a connecting element arranged between the two elements. In particular, in the present case two elements of the multi-chip module are interconnected diagonally by a connecting element arranged between the two elements. In particular, the connecting element, too, is at least partly embedded into the potting. Furthermore, the potting advantageously has, in the region of the first electrically conductive connecting structure, at least one opening in which a contact web extends and makes contact with the first electrically conductive connecting structure.

In accordance with one advantageous embodiment, the connecting element has a second electrically conductive connecting structure, wherein the second connecting structure is designed in such a way that it connects two elements to one another. In particular, it is possible for the connecting element to have a second electrically conductive connecting structure, wherein the second connecting structure is designed in such a way that it connects two elements to one another diagonally. The first or second connecting structure preferably extends diagonally on the carrier. Furthermore, the first and second connecting structures extend on the carrier in particular in a crossed fashion, that is to say, for example, oppositely diagonally. This means that the two connecting structures cross one another in a plan view of the carrier. By way of example, one connecting structure covers the other connecting structure in a crossover region of the connecting structures, in which they intersect in plan view. By means of such a connecting element it is possible to realize electrical connections which cross one another. Preferably, the first and second electrically conductive connecting structures are electrically isolated from one another.

In one preferred embodiment, the second electrically conductive connecting structure is arranged on the first main surface of the carrier. In particular, the first electrically conductive connecting structure is arranged between the carrier and the second electrically conductive connecting structure.

The connecting element advantageously has a height corresponding to the height of the elements to be connected. Given similar or identical height, the electrical connection locations of the elements and at least one contact location of the connecting element preferably lie in one plane, with the result that considerable topography problems do not arise for the interconnection of the elements.

The lateral extent of the connecting element, that is to say the extent parallel to the first main surface or a second main surface, situated opposite the first main surface, is, in particular, smaller than that of the elements to be connected. The connecting element can thus be inserted between the elements to be connected, without disadvantageous effects on the overall size of the multi-chip module. By way of example, the connecting element can have a length of 100 µm to 200 µm in a lateral direction of extent.

In one preferred configuration, the connecting element has the shape of a prism. By way of example, the two main surfaces of the connecting element or of the carrier are formed in a rectangular manner and are arranged parallel to one another. The first or second connecting structure preferably extends diagonally on such a carrier.

Suitable materials for the carrier are, in particular, semiconductor materials, glass, ceramic or plastics materials. The carrier can be formed, for example, from silicon, sapphire or a printed circuit board material such as FR4, composed of glass fiber mats impregnated in epoxy resin. Preferably, the carrier is not electrically conductive, or electrically insulating.

Furthermore, the connecting element preferably comprises at least one insulation layer. The insulation layer is arranged, in particular, on at least one of the two main surfaces. The insulation layer advantageously covers parts of the first and/or second connecting structure.

In accordance with one preferred embodiment, an insulation layer is arranged between the first and second electrically conductive connecting structures.

The insulation layer advantageously contains a plastics material. Suitable materials for the insulation layer are, for example, silicone, polyimide, silicon oxide, titanium oxide or spin-on glass. In particular, the insulation layer contains a radiation-transmissive material.

One suitable method for producing the connecting element consists in applying a first electrically conductive coating, in particular a metallization, to the first main surface of the carrier and structuring it such that the first electrically conductive connecting structure arises.

In accordance with one preferred embodiment, the first connecting structure has at least one first contact location and a conductor track, which runs diagonally, in particular. Furthermore, the first connecting structure can have a second contact location, wherein the first and second contact locations are connected to one another, in particular, by means of the conductor track running diagonally, in particular. Correspondingly, the second connecting structure preferably has a first contact location and a conductor track, which extends diagonally, in particular. Furthermore, the second connecting structure can also have a second contact location, wherein the first and second contact locations are connected to one another, in particular, by means of the conductor track running diagonally, in particular.

In one advantageous configuration, the first contact location and the conductor track of the first connecting structure are arranged on the first main surface.

In accordance with at least one embodiment, the first contact location and the conductor track of the second connecting structure are also arranged on the first main surface. Preferably, the first and second contact locations of the first connecting structure are arranged on the first main surface and the first and second contact locations of the second connecting structure are arranged on the first main surface.

By way of example, the first connecting structure is arranged between the carrier and the second connecting structure, wherein the two connecting structures are electrically isolated from one another in particular by an insulation layer. The electrical connecting bridges which can be produced by means of a such a connecting element in this case run in two different planes, which are arranged parallel to one another, in particular.

In this embodiment, for producing the second connecting structure, a second electrically conductive coating, in particular a metallization, is applied to the insulation layer and structured such that the second electrically conductive connecting structure arises. The two connecting structures are therefore produced by a two-layer metallization.

In accordance with one alternative configuration, the conductor track of the first connecting structure is arranged in such a way that it extends from the first main surface as far as the second main surface of the carrier. By way of example, the conductor track is led over a side surface of the carrier, said side surface connecting the first and second main surfaces to one another. Alternatively, the conductor track can be a plated-through hole extending within the carrier from the first main surface as far as the second main surface. In particular, the first contact location of the first connecting structure is arranged on the first main surface, while the second contact location of the first connecting structure is situated on the second main surface.

Furthermore, the conductor track of the second connecting structure can also be arranged in such a way that it extends from the first main surface as far as the second main surface of the carrier. Preferably, in this case the first contact location of the second connecting structure is arranged on the first main surface, while the second contact location of the second connecting structure is situated on the second main surface. In one preferred development, the conductor tracks of the first and second connecting structures are led over the same side surface.

A connecting element in which the conductor track of the first and/or second connecting structure is arranged in such a way that it extends from the first main surface as far as the second main surface of the carrier can be used, for example, for bridging steps or for producing a vertical bridge between a radiation-emitting component and a substrate on which the radiation-emitting component is arranged.

In accordance with one advantageous method for producing a connecting element in which the conductor track is led over a side surface of the carrier or through the carrier, a carrier assemblage is provided with openings extending from the first main surface as far as the second main surface. The openings are filled with an electrically conductive material, in particular a metal or a metal compound. The carrier assemblage is divided in such a way that the openings are cut and arranged on the side surface in the finished connecting elements. The electrically conductive material of the openings then forms that part of the conductor tracks which is arranged on the side surfaces of the carrier. Alternatively, the carrier assemblage is divided in such a way that the openings are later arranged within the carrier and are completely surrounded circumferentially by the material of the carrier.

It is possible for the connecting element to have further electrically conductive connecting structures besides the first or second connecting structure, with the result that, for example, a plurality of conductor tracks cross one another in a plan view of the carrier. By way of example, the conductor tracks can cross one another in a star-shaped fashion.

In accordance with one alternative embodiment, the connecting element can be a bent or stamped sheet-metal part coated with insulation material at the suitable locations.

Furthermore, the connecting element can be an SMD ("Surface Mounted Device") component such as, for example, a resistor having a low resistance. It is also possible for the connecting element to be embodied as an NTC (Negative Temperature Coefficient) thermistor or as a PTC (Positive Temperature Coefficient) thermistor.

Furthermore, it is conceivable for the connecting element to be an active component which performs the function of a logic, a memory, sensor, ESD protection. Furthermore, the connecting element can comprise a radiation-emitting component.

In accordance with one preferred embodiment of a multi-chip module, the latter comprises a connecting element of the type mentioned above and two elements, wherein the two elements are electrically connected to one another in a wire-free manner by means of the connecting element. Preferably, the multi-chip module is a lighting module comprising a connecting element of the type mentioned above and two elements, at least one of which is a radiation-emitting component, wherein the two elements are electrically connected to one another in a wire-free manner by means of the connecting element. "Electrically connected in a wire-free manner" means, for example, that the connection is not mediated by a wire contact-connection and thus by a so-called "bonding wire." That is to say that in particular the connecting technique of wire bonding is not used for connection.

The radiation-emitting component can be an unpackaged or packaged radiation-emitting semiconductor chip. In one preferred configuration, the radiation-emitting component has two electrical connection locations on its top side. The arrangement of the electrical connection locations on the top side makes it possible for the radiation-emitting components to be electrically connected to one another in a single plane.

The lighting module can comprise a plurality (up to a few hundred) of radiation-emitting components, which in particular are mounted on a common substrate. The substrate preferably simultaneously serves as a heat sink.

In accordance with one preferred embodiment, the lighting module has a plurality of strings of radiation-emitting components interconnected in series, wherein the strings can be interconnected in parallel. The components of a string preferably emit light of the same color. Furthermore, the strings whose components emit light of the same color are advantageously interconnected in parallel.

In one advantageous configuration, the multi-chip module or lighting module has a contact structure comprising at least one contact web, wherein the connecting element and one of the elements are electrically contacted and electrically connected to one another by means of the contact web. In particular, the first connecting structure of the connecting element is electrically contacted by means of the contact web.

By way of example, the first contact location of the connecting element can be connected to a first element, in particular radiation-emitting component, by means of a contact web, while the second contact location of the connecting element is connected to a second element, in particular to the substrate, without a contact web. In this case, in particular, a connecting element having a conductor track running over the side surface or within the carrier is suitable. It is thereby possible to produce a vertical bridge between the two elements.

Alternatively, the second contact location of the connecting element can be connected to a further contact web, which leads to the second element, in particular a further radiation-emitting component.

In accordance with one preferred embodiment, the multi-chip module or lighting module has a potting, into which the connecting element and the two elements are at least partly embedded. In particular, the at least one contact web runs in the potting or on the potting. Leveling of the surface of the multi-chip module or lighting module can be achieved by means of the potting. At the same time, the elements of the multi-chip module or lighting module can be electrically insulated by means of the potting. Preferably, the potting contains a transparent or translucent material. By way of example, the potting can contain silicone, polyimide, silicon oxide, titanium oxide or spin-on glass. Furthermore, the potting can be admixed with a converter provided for the wavelength conversion of the radiation emitted by the radiation-emitting components.

In accordance with one preferred embodiment, the multi-chip module or lighting module has a contact web crossing the first connecting structure of the connecting element. In this case, a connecting element having a single connecting structure on the first main surface is sufficient. Preferably, the potting is arranged on the first connecting structure, the contact web running on said potting. An additional insulation layer is not necessary in this embodiment.

BRIEF DESCRIPTION OF THE DRAWINGS

The connecting element and multi-chip module described here are explained in greater detail below on the basis of exemplary embodiments and the associated Figures.

Elements that are identical, of identical type or act identically are provided with the same reference signs in the figures.

DETAILED DESCRIPTION OF ILLUSTRATIVE EMBODIMENTS

Figure 1:
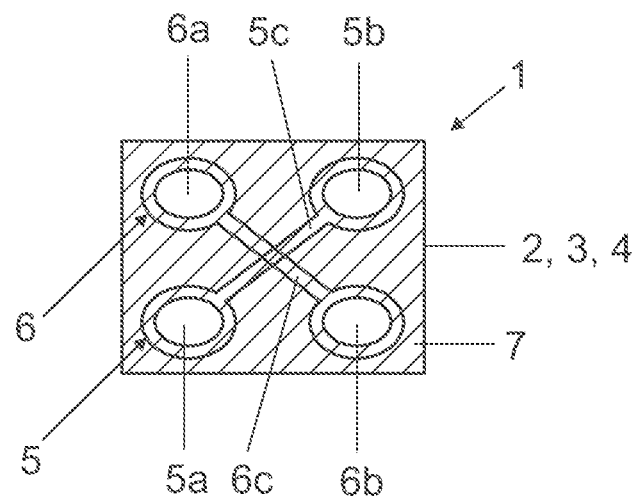
FIGS. 1 and 2 show, in a schematic plan view and a schematic perspective view, a first exemplary embodiment of the connecting element described here.
Figure 2:
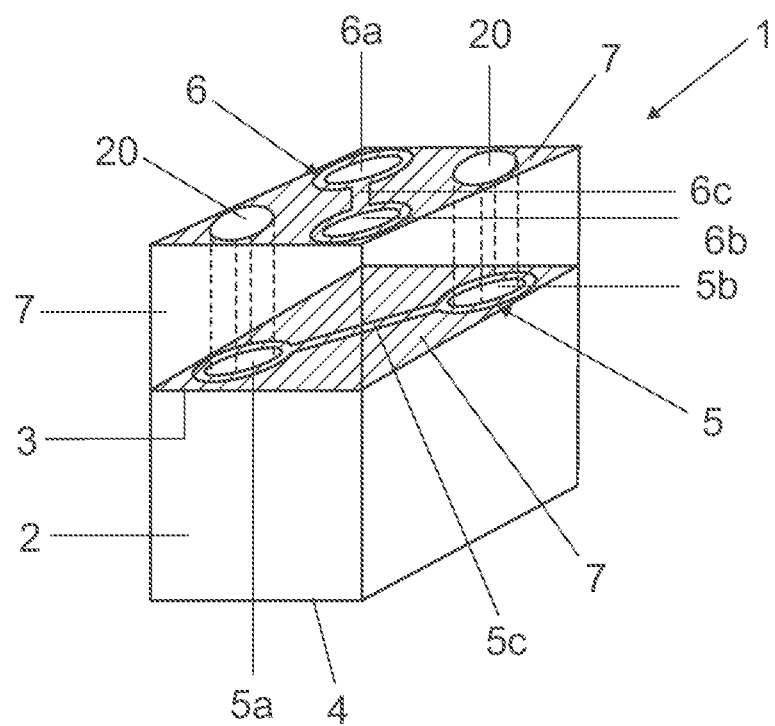

A first exemplary embodiment of a connecting element 1 is illustrated in a schematic plan view in FIG. 1 and in a schematic perspective view in FIG. 2. The connecting element 1 is suitable for realizing an electrical connection between two elements of a multi-chip module, in particular of a lighting module, as described, for example, in association with FIGS. 4 and 5.

The connecting element 1 in accordance with the first exemplary embodiment has a carrier 2 having a first main surface 3 and a second main surface 4, which is situated opposite the first main surface 3. In the exemplary embodiment, the two main surfaces 3, 4 are formed in a rectangular manner and are arranged parallel to one another. Furthermore, the two main surfaces 3, 4 are congruent.

In particular, the carrier 2 is not electrically conductive, or electrically insulating. By way of example, semiconductor materials, glass, ceramic or plastics materials are appropriate for the carrier 2. Preferably, the carrier is formed from silicon, sapphire or a printed circuit board material such as FR4, composed of glass fiber mats impregnated in epoxy resin.

A first electrically conductive connecting structure 5 is arranged on the first main surface 3 of the carrier 2. In particular, the first connecting structure 5 is applied directly on the first main surface 3. For producing the first connecting structure 5, preferably a first electrically conductive coating, in particular a metallization, is applied to the first main surface 3 of the carrier 2 and is structured such that the first electrically conductive connecting structure 5 is generated. The first connecting structure 5 is designed in such a way that it connects in particular a first and second element (not illustrated) of a multi-chip module to one another, in particular to one another diagonally.

In accordance with the first exemplary embodiment, the first connecting structure 5 has a first contact location 5a, a second contact location 5b and a conductor track 5c, which connects the two contact locations 5a, 5b to one another, in particular connects them to one another diagonally. The two contact locations 5a, 5b are embodied in a circular fashion.

Furthermore, an insulation layer 7 is arranged on the first main surface 3 of the carrier 2. Preferably, the first connecting structure 5 is at least partly covered by the insulation layer 7.

Advantageously, the first connecting structure 5 is electrically insulated toward the outside by the insulation layer 7. In particular, the insulation layer 7 is opened in the region of the two contact locations 5a, 5b. At the openings 20 of the insulation layer 7, contact can be made with the two contact locations 5a, 5b from outside.

Moreover, a second electrically conductive connecting structure 6 is arranged on the first main surface 3 of the carrier 2. The second electrically conductive connecting structure 6 is arranged above the first connecting structure 5 proceeding from the carrier 2. The first electrically conductive connecting structure 5 is therefore arranged between the carrier 2 and the second electrically conductive connecting structure 6.

The two connecting structures 5, 6 are electrically isolated from one another by means of the insulation layer 7 arranged between the two connecting structures 5, 6. In a manner corresponding to the first connecting structure 5, the second connecting structure 6 can also be produced by an electrically conductive coating, in particular a metallization, and subsequent structuring of the coating.

In the first exemplary embodiment, the second connecting structure 6 also has a first contact location 6a, a second contact location 6b and a conductor track 6c, which connects the two contact locations 6a, 6b to one another, in particular connects them to one another diagonally. The two contact locations 6a, 6b are embodied in a circular fashion. The insulation layer 7 can partly cover the second connecting structure 6. Advantageously, the insulation layer 7 is opened in the region of the two contact locations 6a, 6b. At the openings of the insulation layer 7, contact can be made with the two contact locations 6a, 6b from outside.

The first and second connecting structures 5, 6 are arranged on the carrier 2 in a crossed manner, oppositely diagonally in the exemplary embodiment. As is evident from FIG. 1, the two connecting structures 5, 6 cross one another in this case. By means of such a connecting element 1, it is possible to realize electrical connections which cross one another.

A connecting element 1 in accordance with the first exemplary embodiment is suitable, on account of the lateral extension of the first and respectively second connecting structures 5, 6, in particular for the formation of a horizontal connecting bridge between a first and a second element. In this case, the lateral extension should be understood to mean an extent parallel to one of the two main surfaces 3, 4. In the case of the horizontal connecting bridge, the connections of the two elements to be connected lie substantially in one plane.

The lateral extent of the connecting element 1 is, in particular, smaller than that of the elements to be connected. By way of example, the connecting element 1 can have a length of 100 μm to 200 μm in a lateral direction of extent.

Figure 3:
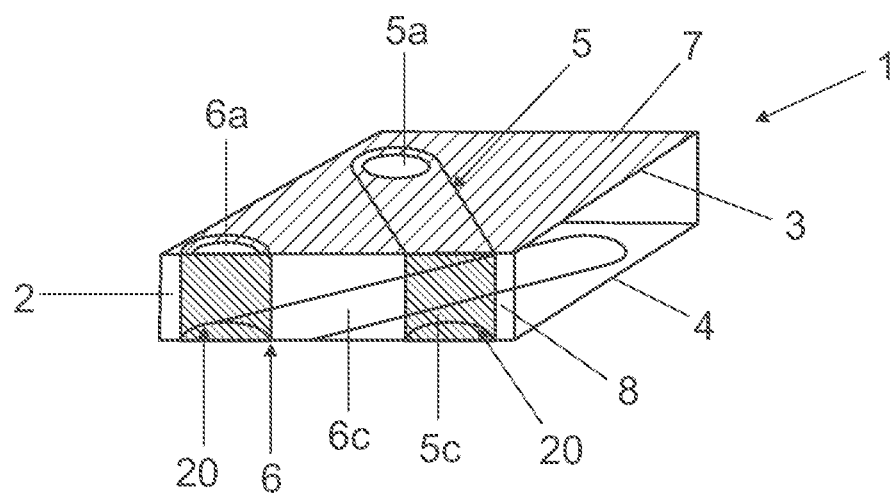
FIG. 3 shows in a schematic perspective view, a second exemplary embodiment of the connecting element described here.

A second exemplary embodiment of a connecting element 1 is illustrated in schematic perspective view in FIG. 3. The connecting element 1 is suitable, in particular, for realizing a vertical connecting bridge between a first and a second element of a multi-chip module. In the case of the vertical connecting bridge, the connections of the two elements to be connected lie in different planes, preferably arranged parallel.

The connecting element 1 in accordance with the second exemplary embodiment has a carrier 2 having a first main surface 3 and a second main surface 4, which is situated opposite the main surface 3. Furthermore, the connecting element 1 has a first and a second electrically conductive connecting structure 5, 6. The connecting element 1 has the form of a prism.

As in the first exemplary embodiment, in the second exemplary embodiment, too, the carrier 2 is in particular not electrically conductive, or electrically insulating. Semiconductor materials, glass, ceramic or plastics materials are correspondingly appropriate for the carrier 2. Preferably, the carrier is formed from silicon, sapphire or a printed circuit board material such as FR4, composed of glass fiber mats impregnated in epoxy resin.

In the connecting element 1 in accordance with the second exemplary embodiment, the first and second connecting structures 5, 6 each have a conductor track 5c, 6c extending from the first main surface 3 as far as the second main surface 4. The conductor tracks 5c, 6c are led over a side surface 8 of the carrier 2, said side surface connecting the first and second main surfaces 3, 4 to one another. In this case, the first contact location 5a of the first connecting structure 5 is arranged on the first main surface 3, while the second contact location (not designated) of the first connecting structure 5 is situated on the second main surface 4. The first contact location 6a of the second connecting structure 6 is likewise arranged on the first main surface 3, while the second contact location (not designated) of the second connecting structure 6 is situated on the second main surface 4.

The first and second connecting structures 5, 6 are designed in such a way that they connect in particular a first and second element (not illustrated) of a multi-chip module to one another, in particular connect them to one another diagonally. In the second exemplary embodiment, too, the two connecting structures 5, 6 are arranged in a crossed manner, in particular oppositely diagonally.

For producing the connecting element 1 in accordance with the second exemplary embodiment, a carrier assemblage, which can be singulated into a plurality of carriers or connecting elements, is provided with openings 20 extending from the first main surface as far as the second main surface. The openings are filled with an electrically conductive material, in particular a metal or a metal compound. The carrier assemblage is divided in such a way that the openings are cut and are arranged on the side surfaces in the finished connecting elements. The electrically conductive material of the openings forms that part of the conductor tracks 5c, 6c which is arranged on the side surface 8 of the carrier 2.

In contrast to the illustration in FIG. 3, however, it is also conceivable for the carrier assemblage to be divided in such a way that the openings run within the carrier 2 and are circumferentially completely surrounded by the material of the carrier 2.

An insulation layer 7 is arranged on the first main surface 3 of the carrier 2. Preferably, the first connecting structure 5 is at least partly covered by the insulation layer 7. Advantageously, the first connecting structure 5 is electrically insulated toward the outside by the insulation layer 7. In particular, the insulation layer 7 is opened in the region of the first contact location 5a of the first connecting structure 5 and in the region of the first contact location 6a of the second connecting structure 6. At the openings of the insulating layer 7, contact can be made with the two contact locations 5a, 6a from outside.

It is also possible for an insulation layer 7 to be arranged on both main surfaces 3, 4 or on neither of the two main surfaces 3, 4.

Figure 4:
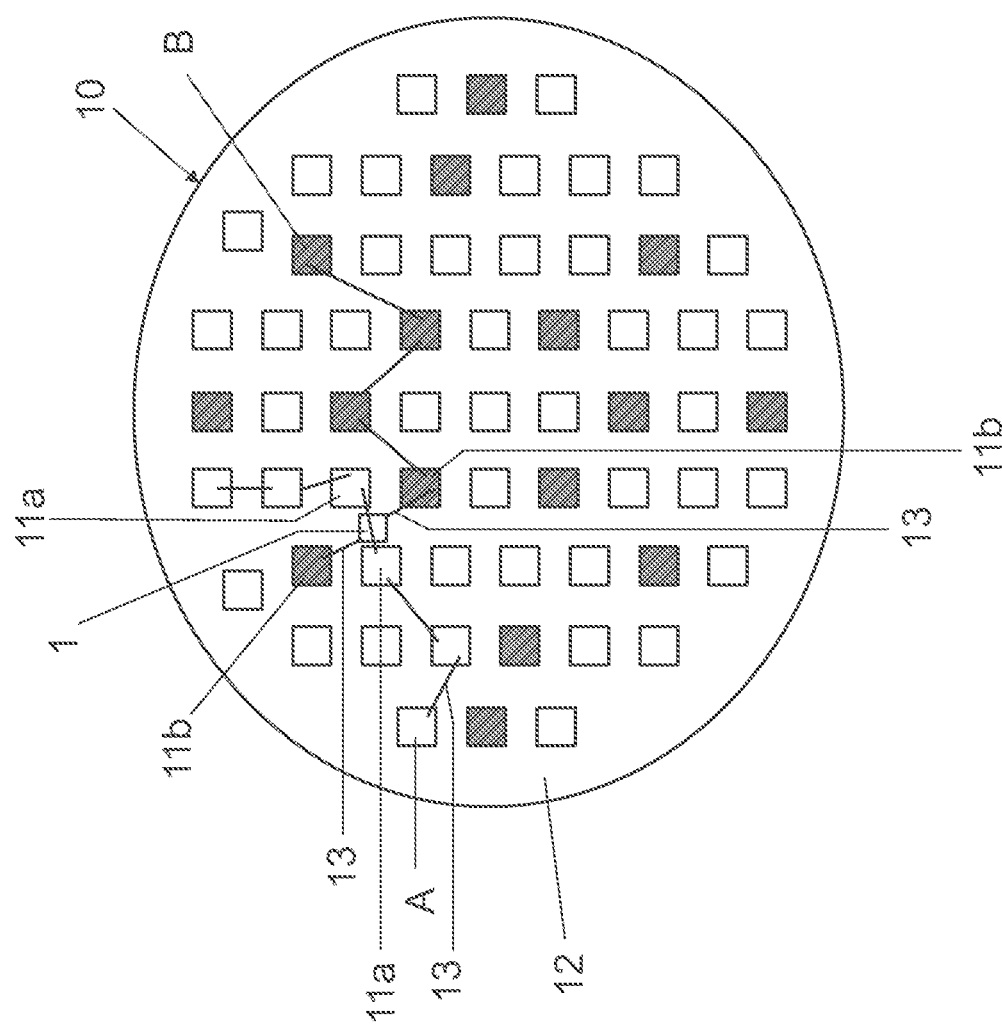
FIGS. 4 and 5 show, in a schematic plan view and a schematic side view, an exemplary embodiment of the multi-chip module described here, said multi-chip module being a lighting module.
Figure 5:
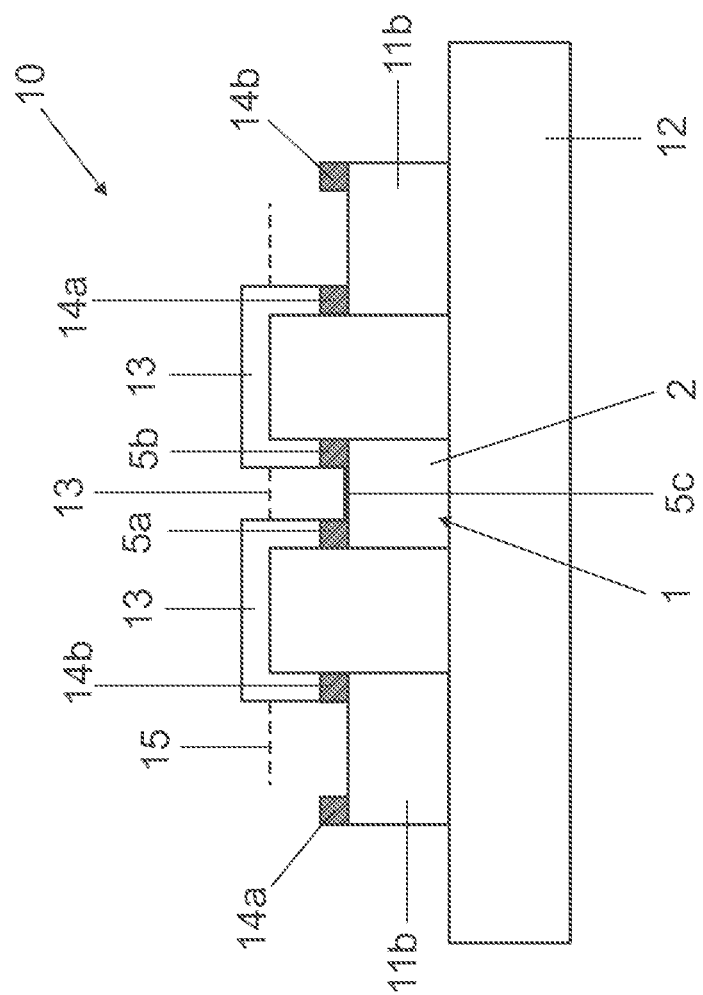

One exemplary embodiment of a lighting module 10 is illustrated in a schematic plan view in FIG. 4. FIG. 5 shows an excerpt from the lighting module 10 illustrated in FIG. 4, along a string B in a schematic side view.

The lighting module 10 comprises a plurality of radiation-emitting components 11a, 11b. The components 11a emit radiation of a first color. The components 11b emit radiation of a second color. By way of example, the components 11a can each comprise a semiconductor chip which generates blue light, and also a converter which converts the blue light into a mint green color. Furthermore, the components 11b can emit red light. By means of a suitable ratio of components 11a, and components 11b, the emission spectrum of the lighting module 10 can advantageously be set in such a way that the lighting module 10 emits white light having a color locus on the Planckian curve. It is also conceivable for the lighting module 10 to comprise red, green and blue light-emitting diodes, the emitted radiation of which is mixed to form white light having a color locus on the Planckian curve.

The lighting module 10 furthermore comprises a substrate 12, on which the radiation-emitting components 11a, 11b are mounted. The components 11a, 11b are advantageously distributed uniformly on the substrate 12, such that optimum color mixing can be obtained. In particular, the substrate 12 simultaneously serves as a heat sink.

The lighting module 10 comprises strings A, B of radiation-emitting components 11a, 11b interconnected in series. The components 11a of the string A emit light of the same color. Likewise, the components 11b of the string B emit light of the same color. The remaining radiation-emitting components, which are not designated more specifically in FIG. 4, can be interconnected in a corresponding manner. Strings whose components emit light of the same color can be interconnected in parallel.

Furthermore, the lighting module 10 comprises a connecting element 1 of the type mentioned above having a carrier 2 and a first connecting structure. Two radiation-emitting components 11b of the string B are electrically connected to one another in a wire-free manner by means of the connecting element 1.

Furthermore, the lighting module 10 comprises a contact structure having a plurality of contact webs 13. The two radiation-emitting components 11b are connected to the connecting element 1 by a contact web 13 in each case. The respective radiation-emitting component 11b and the connecting element 1 are electrically contacted by means of the common contact web 13. In particular, the first connecting structure of the connecting element 1 is electrically contacted by means of the contact web 13. The first and second contact locations 5a, 5b of the connecting element 1, which are both arranged on the first main surface of the carrier 2, are connected to the radiation-emitting components 11b by means of the respective contact web 13.

The radiation-emitting components 11b have in each case two electrical connection locations 14a, 14b on their top sides. The connection location 14b of one radiation-emitting component 11b is connected to the first contact location 5a of the connecting element 1 by means of a contact web 13. The connection location 14a of the further radiation-emitting component 11b is connected to the second contact location 5a of the connecting element 1 by means of a further contact web 13.

The arrangement of the electrical connection locations 14a, 14b on the top side makes it possible for the radiation-emitting components 11b to be electrically connected to one another in a single plane. In this case, the connecting element 1 forms a horizontal connecting bridge between the two components 11b. The connecting element 1 advantageously has a height corresponding to the height of the radiation-emitting components 11b. Given a similar or identical height, the electrical connection locations 14a, 14b and the contact locations 5a, 5b lie substantially in one plane, with the result that considerable topography problems do not arise for the interconnection of the elements.

The lateral extent of the connecting element 1 is, in particular, smaller than that of the radiation-emitting components 11b. Consequently, the connecting element 1 can be inserted between the elements to be connected, without disadvantageous effects on the overall size of the lighting module 10. By way of example, the connecting element 11 can have a length of 100 μm to 200 μm in a lateral direction of extent.

The lighting module 10 has a potting 15, into which the connecting element 1 and the radiation-emitting components 11a, 11b are embedded. Leveling of the lighting module surface can be achieved by means of the potting 15. Preferably, the potting 15 contains a transparent or translucent material. By way of example, the potting 15 can contain silicone, polyimide, silicon oxide, titanium oxide or spin-on glass.

In the lighting module 10 illustrated, vertical sections of the contact webs 13 run in the potting 15, while horizontal sections extend on the potting 15.

For producing the contact webs 13, an electrically conductive coating is applied to the surface of the potting 15 and is structured such that the electrical connection locations 14a, 14b of the radiation-emitting components 11a, 11b and the contact locations 5a, 5b are connected by the contact webs 13. The potting 15 is opened in the region of the electrical connection locations 14a, 14b and of the contact locations 5a, 5b, such that the electrically conductive coating or the contact webs 13 extend as far as the electrical connection locations 14a, 14b and the contact locations 5a, 5b.

The lighting module 10 furthermore has a contact web 13 crossing the first connecting structure of the connecting element 1. Said contact web 13 connects two radiation-emitting components 11a of the string A. The connecting element 1 therefore enables the crossover of two electrical connecting bridges.

By means of the potting 15, the crossing contact web 13 is electrically insulated from the connecting structure 5 of the connecting element 1. Consequently, the insulation layer arranged on the first main surface and illustrated in FIGS. 1 and 2 can be omitted. Furthermore, in the case of the lighting module 10 illustrated, it is sufficient if the connecting element 1 has a single connecting structure. The crossing contact web 13 can replace the second connecting structure.

It goes without saying that the lighting module 10 can have further connecting elements 1 between the radiation-emitting components 11a, 11b for forming horizontal or vertical connecting bridges. By way of example, the marginal components 11a, 11b can be electrically connected to the substrate 12 by means of a connecting element having a conductor track which extends from the first to the second main surface of the carrier and which is led over the side surface, for example, as described in conjunction with FIG. 3.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A connecting element for a multi-chip module, the connecting element being provided for realizing an electrical connection between a plurality of elements, the connecting element comprising:
   a carrier;
   an insulation layer made of a radiation-transmissive material;

a first electrically conductive connecting structure, wherein the first connecting structure is designed in such a way that it connects first and second elements to one another; and a second electrically conductive connecting structure, wherein the second connecting structure is designed in such a way that it connects third and fourth elements to one another, wherein the first and second connecting structures extend on the carrier in a crossed fashion, wherein the first connecting structure has a first and a second contact location, which are connected to one another by a first conductor track, wherein the second connecting structure has a first and a second contact location, which are connected to one another by a second conductor track, wherein the first contact locations of the first and second connecting structures are arranged on a first main surface and the second contact locations of the first and second connecting structures are arranged on a second main surface, which is situated opposite the first main surface, wherein the insulation layer is arranged on the first main surface so that the first connecting structure is partly covered by the insulation layer, the first connecting structure is electrically insulated toward an outside of the connecting element by the insulation layer, the insulation layer is opened in a region of the first contact location of the first connecting structure and in a region of the first contact location of the second connecting structure so that the two contact locations are contactable from the outside, and wherein the carrier comprises openings extending from the first main surface to the second main surface, the openings are filled with an electrically conductive material forming an electrical connection between the first and the second main surfaces, the openings are arranged along side surfaces of connecting element, the electrically conductive material of the openings forms a part of the first and second conductor tracks which is arranged on a side surface of the carrier.

2. The connecting element according to claim 1, wherein the connecting element has a shape of a prism, and wherein the first connecting structure or the second connecting structure is supported by the carrier.

3. The connecting element according to claim 1, wherein the carrier comprises an electrically insulating carrier.

4. The connecting element according to claim 1, wherein the carrier comprises a semiconductor material, a glass, a ceramic or a plastics material.

5. A multi-chip module comprising
a connecting element according to claim 1, and
two elements, wherein the two elements are electrically connected to one another in a wire-free manner by the connecting element.

6. The multi-chip module according to claim 5, wherein the multi-chip module includes a contact structure comprising a contact web, wherein the connecting element and one of the elements are electrically contacted and electrically connected to one another by the contact web.

7. The multi-chip module according to claim 6, wherein the first connecting structure of the connecting element is electrically contacted by the contact web.

8. The multi-chip module according to claim 6, further comprising a potting, wherein the connecting element and the two elements are at least partly embedded in the potting and wherein the contact web runs in the potting or on the potting.

9. The multi-chip module according to claim 5, further comprising a contact web crossing the first connecting structure.

10. A lighting module comprising
a connecting element according to claim 1; and
two elements electrically connected to one another in a wire-free manner by the connecting element, one of the two elements comprising a radiation-emitting component.

11. The lighting module according to claim 10, wherein the two elements both comprise radiation-emitting components.

* * * * *